(12) United States Patent
Chujo et al.

(10) Patent No.: US 10,629,654 B2
(45) Date of Patent: Apr. 21, 2020

(54) THIN FILM TRANSISTOR ARRAY FORMED SUBSTRATE, IMAGE DISPLAY DEVICE SUBSTRATE AND MANUFACTURING METHOD OF THIN FILM TRANSISTOR ARRAY FORMED SUBSTRATE

(71) Applicant: TOPPAN PRINTING CO., LTD., Taito-ku (JP)

(72) Inventors: Hina Chujo, Taito-ku (JP); Mamoru Ishizaki, Taito-ku (JP)

(73) Assignee: TOPPAN PRINTING CO., LTD., Taito-ku (JP)

(*) Notice: Subject to any disclaimer, the term of this patent is extended or adjusted under 35 U.S.C. 154(b) by 0 days.

(21) Appl. No.: 15/790,535

(22) Filed: Oct. 23, 2017

(65) Prior Publication Data

US 2018/0061892 A1 Mar. 1, 2018

Related U.S. Application Data

(63) Continuation of application No. PCT/JP2016/002071, filed on Apr. 18, 2016.

(30) Foreign Application Priority Data

Apr. 22, 2015 (JP) .................. 2015-087530
Aug. 26, 2015 (JP) .................. 2015-167130

(51) Int. Cl.
*H01L 27/28* (2006.01)
*H01L 51/05* (2006.01)
(Continued)

(52) U.S. Cl.
CPC ........ *H01L 27/283* (2013.01); *H01L 27/3274* (2013.01); *H01L 29/786* (2013.01);
(Continued)

(58) Field of Classification Search
None
See application file for complete search history.

(56) References Cited

U.S. PATENT DOCUMENTS

2003/0222315 A1* 12/2003 Amundson ............ G09G 3/344
257/368
2009/0272966 A1 11/2009 Yamaga et al.
(Continued)

FOREIGN PATENT DOCUMENTS

| JP | 2014-67884 A | 4/2014 |
| WO | WO 2008/015947 A1 | 2/2008 |
| WO | WO 2012/172985 A1 | 12/2012 |

OTHER PUBLICATIONS

International Search Report dated Jul. 5, 2016 in PCT/JP2016/002071, filed Apr. 18, 2016.
(Continued)

*Primary Examiner* — Walter H Swanson
*Assistant Examiner* — Kien C Ly
(74) *Attorney, Agent, or Firm* — Oblon, McClelland, Maier & Neustadt, L.L.P.

(57) ABSTRACT

A thin film transistor array formed substrate including a gate electrode, a gate insulation layer, a source wiring structure including a source wiring and a source electrode, a drain electrode, a pixel electrode connected to the drain electrode, a semiconductor layer formed in a stripe shape having a longitudinal side extending in a direction that the source wiring extends, and a protection layer formed to cover an entire portion of the semiconductor layer. The source wiring structure has notch portions positioned in the direction that the source wiring extends such that the notch portions overlap with the gate electrode, the source wiring has a first portion having a first width where the notch portions are formed and a second portion having a second width larger
(Continued)

than the first width where no notch portions are formed, and the source wiring has an opening in the second portion.

14 Claims, 6 Drawing Sheets

(51) Int. Cl.
*H01L 51/10* (2006.01)
*H01L 51/00* (2006.01)
*H01L 29/786* (2006.01)
*H01L 27/32* (2006.01)
*H01L 27/12* (2006.01)

(52) U.S. Cl.
CPC ...... *H01L 51/0005* (2013.01); *H01L 51/0022* (2013.01); *H01L 51/0545* (2013.01); *H01L 51/105* (2013.01); *H01L 51/107* (2013.01); *H01L 27/1292* (2013.01)

(56) References Cited

U.S. PATENT DOCUMENTS

| | | |
|---|---|---|
| 2012/0001189 A1 | 1/2012 | Matsubara et al. |
| 2016/0190159 A1* | 6/2016 | Ding .................... H01L 27/124 257/72 |

OTHER PUBLICATIONS

Extended European Search Report dated Apr. 5, 2018 in Patent Application No. 16782794.8, 5 pages.

* cited by examiner

Related Art

THIN FILM TRANSISTOR ARRAY FORMED SUBSTRATE, IMAGE DISPLAY DEVICE SUBSTRATE AND MANUFACTURING METHOD OF THIN FILM TRANSISTOR ARRAY FORMED SUBSTRATE

CROSS-REFERENCE TO RELATED APPLICATIONS

The present application is a continuation of International Application No. PCT/JP2016/002071, filed Apr. 18, 2016, which is based upon and claims the benefits of priority to Japanese Application No. 2015-087530, filed Apr. 22, 2015 and Japanese Application No. 2015-167130, filed Aug. 26, 2015. The entire contents of all of the above applications are incorporated herein by reference.

BACKGROUND OF THE INVENTION

Field of the Invention

The present invention relates to a substrate for forming a thin film transistor array, an image display device substrate and a manufacturing method of a substrate for forming a thin film transistor array.

Discussion of the Background

To form patterns of a semiconductor layer and a protection layer in the thin film transistors, a method is utilized in which each of the semiconductor layer and the protection layer are formed on the entire surface, resist patterns are formed, and etching is applied to the resist patterns using etchant so as to form the patterns. However, with this method, the resist has to be film-formed followed by the etching for every time when forming respective patterns. As a result, the number of manufacturing steps increases.

As an example, according to WO2012/172985, thickness of the resist is adjusted to form the pattern by using only one photolithography process. However, the photolithography process cannot be omitted.

On the other hand, when using a printing technique to form the semiconductor layer and the protection layer, especially when liquid is used for the material of the semiconductor layer and the protection layer, desired pattern may not be formed.

FIGS. 6A and 6B are plan views schematically showing an example of a conventional thin film transistor array formed substrate 50, and FIG. 6C shows a cross-sectional view sectioned across A-A' line of FIG. 6B.

As shown in FIG. 6A, when viewing a layout as a planar arrangement, the gate electrode 2 is connected to the gate wiring 2', the source wiring 4 also serves as the source electrode, the source wiring 4 has periodic notch portions, the source wiring 4 intersects the gate wiring 2', and the notch portions of the source wiring 4 are formed on the gate electrode 2. Drain electrodes 5 are formed in the notch portions of the source wiring 4, facing the source wiring 4.

In the case where the semiconductor layer 6 is formed on the thin film transistor array formed substrate 50 which is formed in this manner, and the protection layer 7 is formed in a stripe pattern, as shown in FIG. 6B, the semiconductor layer 6 can be formed to connect the source wiring 4 and the drain electrode 5, however, the protection layer 7 may be formed to cover a part of the semiconductor layer 6, the source wiring 4 and the gate insulation layer 3, excluding a part of semiconductor layer 6 in the drain electrode 5 side and a part of the source wiring 4. In other words, a part of the semiconductor layer 6 may not be covered by the protection layer 7.

As shown in FIG. 6C, where the cross-sectional view across the line A-A' shown in FIG. 6B is illustrated, the gate electrode 2 and the gate wiring 2' are formed on the substrate 1, which are covered by the gate insulation layer 3, and further the source wiring 4 and the drain electrode 5 are formed thereon. The semiconductor layer 6 is formed at a channel portion between the source wiring 4 and the drain electrode 5, and the protection layer 7 is formed to cover the source wiring 4 and the semiconductor layer 6, excluding a part of the semiconductor layer 6 on the drain electrode 5 side.

Thus, according to the conventional structure, the shape of the protection layer 7 is sometimes worsened. The inventors have found out the cause of this problem is that liquid state ink on the wiring flows onto the gate insulation layer 3.

In FIG. 6A, the surface of the gate insulation layer 3 has ink affinity properties, and the surfaces of the source wiring 4, the drain electrode 5 and the pixel electrode 9 have ink repellent properties. Since the ink used for printing the semiconductor layer 6 is liquid, but has properties being unlikely to be influenced by the wettability of the surface to be printed, the semiconductor layer 6 can be printed in a stripe shape as expected. On the other hand, an ink used for printing the protection layer 7 is also a liquid. However, an ink affinity portion of the surface to be printed is likely to be wet and an ink repellent portion is unlikely to be wet, whereby the ink on the source wiring 4 and the drain electrode 5 is repelled to move onto the gate insulation layer 3, producing an irregular shape shown in FIGS. 6B and 6C. This is what the inventors have discovered.

SUMMARY OF THE INVENTION

According to an aspect of the present invention, a thin film transistor array formed substrate includes a gate electrode, a gate insulation layer, a source wiring structure including a source wiring and a source electrode, a drain electrode, a pixel electrode connected to the drain electrode, a semiconductor layer forming in a stripe shape having a longitudinal side extending in a direction that the source wiring extends, and a protection layer formed to cover an entire portion of the semiconductor layer. The source wiring structure has notch portions positioned in the direction that the source wiring extends such that the notch portions overlap with the gate electrode, the source wiring has a first portion having a first width where the notch portions are formed and a second portion having a second width larger than the first width where no notch portions are formed, and the source wiring has an opening in the second portion.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 1A-1C are a set of diagrams in which FIG. 1A is a plan view schematically showing an example of a substrate for forming a thin film transistor array during a manufacturing process according to the present invention, and FIGS. 1B and 1C are a plan view and a cross-sectional view respectively, schematically showing an example of the substrate for forming the thin film transistor array according to the present invention;

FIGS. 2A-2C are a set of diagrams in which FIG. 2A is a plan view schematically showing an example of a substrate for forming a thin film transistor array during a manufacturing process according to the present invention, and FIGS. 2B and 2C are a plan view and a cross-sectional view respectively, schematically showing an example of the substrate for forming the thin film transistor array according to the present invention;

FIGS. 3A-3C are a set of diagrams in which FIG. 3A is a plan view schematically showing an example of a substrate for forming a thin film transistor array during a manufacturing process according to the present invention, and FIGS. 3B and 3C are a plan view and a cross-sectional view respectively, schematically showing an example of the substrate for forming the thin film transistor array according to the present invention;

FIGS. 4A-4C are a set of diagrams in which FIG. 4A is a plan view schematically showing an example of a substrate for forming a thin film transistor array during a manufacturing process according to the present invention, and FIGS. 4B and 4C are a plan view and a cross-sectional view respectively, schematically showing an example of the substrate for forming the thin film transistor array according to the present invention;

FIGS. 5A-5C is a set of diagrams including plan views and a cross-sectional view each schematically showing an example of a substrate for forming a thin film transistor array during a manufacturing process according to the present invention, in which FIG. 5A shows an interlayer insulation later and openings of the interlayer insulation layer formed therein, FIG. 5B shows upper pixel electrodes formed on the interlayer insulation layer, and FIG. 5C shows a cross-sectional view sectioned across line F-F' of FIG. 5B; and FIGS. 6A-6C are a set of diagrams in which FIG. 6A is a plan view schematically showing an example of a substrate for forming a thin film transistor array during a manufacturing process according to a conventional art, and FIGS. 6B and 6C are a plan view and a cross-sectional view respectively, schematically showing an example of the substrate for forming the thin film transistor array according to a conventional art.

DESCRIPTION OF THE EMBODIMENTS

Figure 1A:
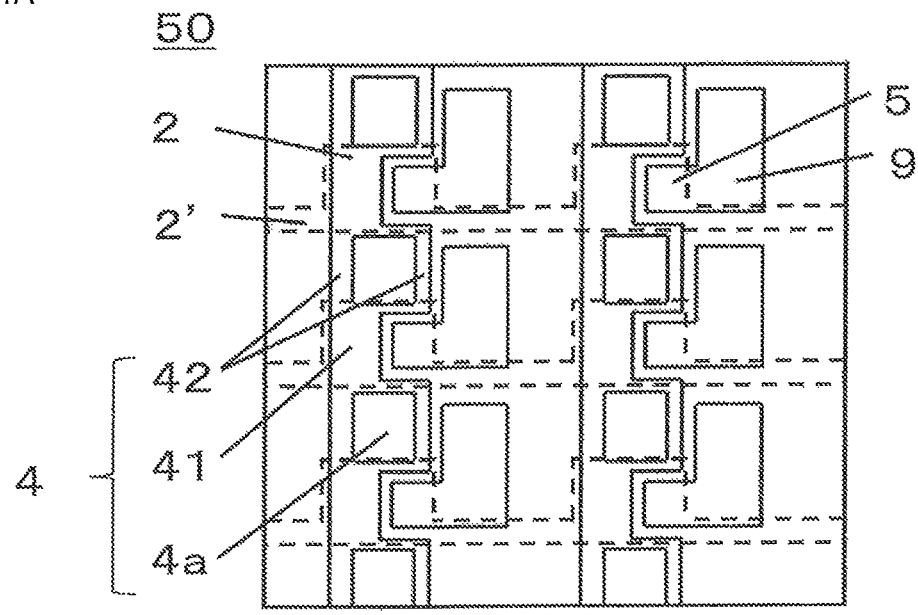

The embodiments will now be described with reference to the accompanying drawings, wherein like reference numerals designate corresponding or identical elements throughout the various drawings.

With reference to the drawings, hereinafter, embodiments of the present invention will be described in detail.

First Embodiment

Figure 1B:
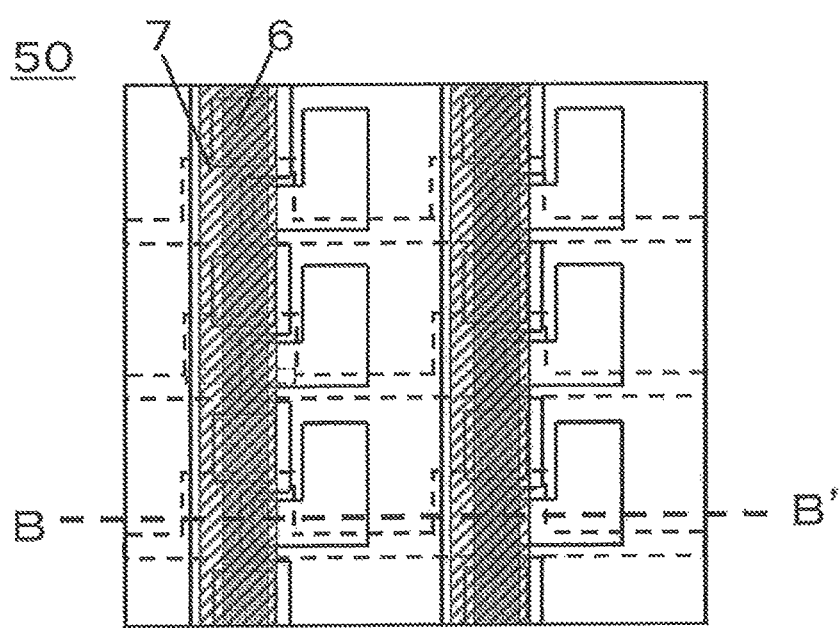
Figure 1C:
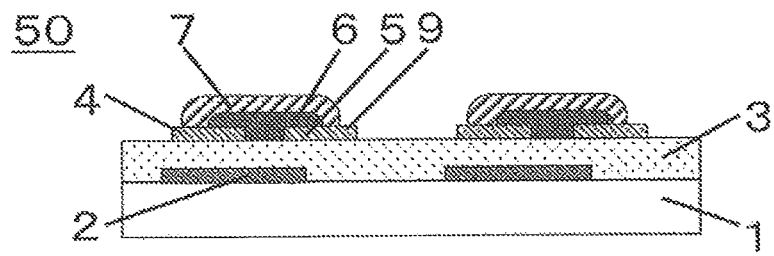

With reference to FIGS. 1A-1C, a first embodiment of the present invention will be described.

An example of a thin film transistor array formed substrate 50 according to the first embodiment of the present invention is shown in FIGS. 1A-1C.

FIGS. 1A and 1B are plan view schematically showing an example pf the thin film transistor array formed substrate 50 of the present invention. FIG. 1C is a cross-sectional view sectioned across the line B-B' of FIG. 1B. As shown in FIG. 1A, when viewing a layout as a planar arrangement, the gate wiring 2' also serves as the gate electrode 2, and the source wiring 4 also serves as the source electrode 4 having notch portions which are formed periodically, the source wiring 4 intersects the gate wiring 2', and the notch portions of the source wiring 4 are formed at portions overlapping the gate electrode 2. The source wiring 4 is composed of a source wiring 41 which is formed of the notch portions, having a small width, and a source wiring 42 located at a portion where no notch portion is formed, having a large width. According to the present embodiment, the source wiring 4 has an opening 4a in the source wiring 42 having a large width. The source wiring 4 and the drain electrode 5 are formed to form slit portions at regular intervals as the channel portions of the thin film transistors, such that the drain electrode 5 is formed, facing to each other, in the notch portion of the source wiring 4 also serving as the source electrode. A pixel electrode 9 is connected to the drain electrode 5. Note that the notch portions of the source wiring 4 serving as the source electrode are formed corresponding to periodical arrangement of the thin film transistor array arranged in a matrix.

As shown in FIG. 1B, the semiconductor layer 6 is formed in a stripe shape having the longitudinal side extending in a direction where the source wiring 4 extends, and formed across the source wiring 4 and the drain electrode 5. The semiconductor layer 6 does not cover at least a portion in the drain electrode 5 side between both ends of the opening 4a in the width direction of the wide source wiring 42 (direction orthogonally to the direction where the source wiring 4 extends), forming a portion between the semiconductor layer 6 and the source wiring 4, in which the gate insulation layer 3, as an under layer, is exposed. The protection layer 7 is formed to cover the entire portion of the semiconductor layer 6 and the opening 4a. Also, the protection layer 7 is not formed on the source wiring 4 in the drain electrode 5 side, and is formed on the source wiring 4 located in a side opposite to the drain electrode 5 than to the opening 4a.

The cross-sectional view sectioned across the line B-B' of FIG. 1B is shown in FIG. 1C. As shown in FIG. 1C, the gate electrode 2 and the gate wiring 2' are formed on the substrate 1, which is covered with the gate insulation layer 3. Further, the source wiring 4 and the drain electrode 5 are formed thereon. The semiconductor layer 6 is formed at the channel portion between the source wiring 4 and the drain electrode 5. The protection layer 7 is formed so as to cover the source wiring 4 also serving as the source electrode, a part of the drain electrode 5 and the semiconductor layer 6.

In FIG. 1A, the surface of the gate insulation layer 3 has ink affinity properties, and the surfaces of the source wiring 4, the drain electrode 5 and the pixel electrode 9 have ink repellent properties. Since the ink used for printing the semiconductor layer 6 is liquid, but has properties being unlikely to be influenced by the coating properties on the surface to be printed, the semiconductor layer 6 can be printed in a stripe shape as expected. In this case, it is preferable that the semiconductor layer 6 does not cover a drain side portion of the opening 4a. The ink used for printing the protection layer 7 is liquid, and the ink affinity portion of the surface to be printed is likely to be wet. Hence, even the ink repellent portion is unlikely to be wet, because of the opening 4a included in the source wiring 4, the ink of the protection layer 7 tends to remain in the source wiring 4, thereby preventing the ink from leaking onto the gate insulation layer 3.

The thin film transistor array formed substrate 50 can be manufactured by performing processes in the order of a process of forming the gate electrode 2 on the substrate 1, a process of forming the gate insulation layer 3 on the substrate 1 including the gate electrode 2, a process of simultaneously forming the source wiring 4/source electrode, the drain electrode 5 and the pixel electrode 9, a process of forming the semiconductor layer 6, and a process of forming the protection layer 7.

The material used for the substrate 1 according to the embodiment of the present invention is not specifically limited. Material generally used include flexible plastic materials such as polyethylene terephthalate (PET), polyimide, polyether sulfone (PES), polyethylene naphthalate (PEN) and polycarbonate, a glass substrate such as quartz, and a silicon wafer. However, taking required flexibility and each process temperature into consideration, PEN or polyimide is preferably used as the substrate.

In the embodiments of the present invention, the electrode materials used for the gate electrode 2, the gate wiring 2', the source wiring 4, the drain electrode 5 and the pixel electrode 9 are not limited. However, a generally used material may be a thin film made of a metal or metal oxide such as gold, platinum, nickel, indium and indium tin oxide; or may be a solution in which a conductive polymer such as poly (ethylenedioxythiophene)/polystyrene sulfonate (PEDOT/PSS) and polyaniline, or metal colloidal particles such as gold, silver and nickel are dispersed, or may be a thick film paste using metal particles such as silver as a conductive material. A method for forming the gate electrode 2, the gate wiring 2', the source wiring 4, the drain electrode 5 and the pixel electrode 9 may include an ink jet method, flexographic printing, screen printing, a dispenser and offset printing.

In the embodiments of the present invention, a material used for the gate insulation layer 3 is not specifically limited. Generally used materials include a polymer solution such as polyvinyl phenol, polymethylmethacrylate, polyimide, polyvinylalcohol, and a solution in which particles such as alumina or silica gel are dispersed.

In the embodiments of the present invention, materials used for a semiconductor material of the semiconductor layer 6 are not specifically limited. Generally used materials may include polythiophene, polyallylamine, fluorenebithiophene-copolymer and polymer-based organic semiconductor materials which are similar to these derivatives, or pentacene, tetracene, copper phthalocyanine, perylene and low-molecule-based organic semiconductor material which are similar to these derivatives. However, considering requirements of low cost, flexibility and large area, it is preferable to use an organic semiconductor material to which a printing method can be applied. Methods of forming the semiconductor layer 6 include an ink jet method, flexographic printing, screen printing, and a dispenser or the like.

In the embodiments of the present invention, the material used for the protection layer 7 is not specifically limited. As a generally used material, fluorine based resin or polyvinylalcohol can be used, however, it is not limited to these materials. For the protection layer 7, light shielding properties can be applied as needed. A method of forming the protection layer 7 includes an ink jet method, flexographic printing, screen printing, and a dispenser or the like.

Second Embodiment

Figure 2A:
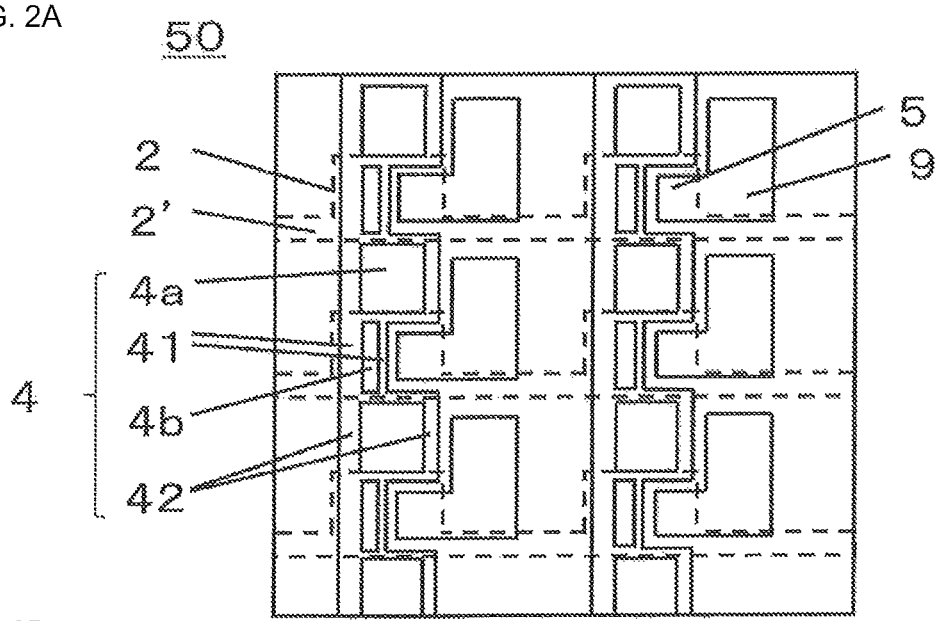
Figure 2B:
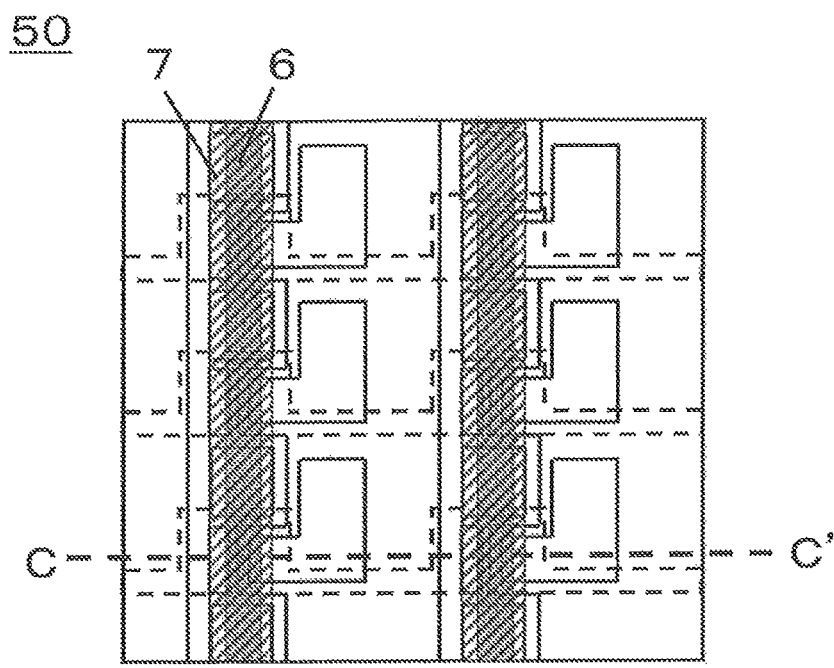
Figure 2C:
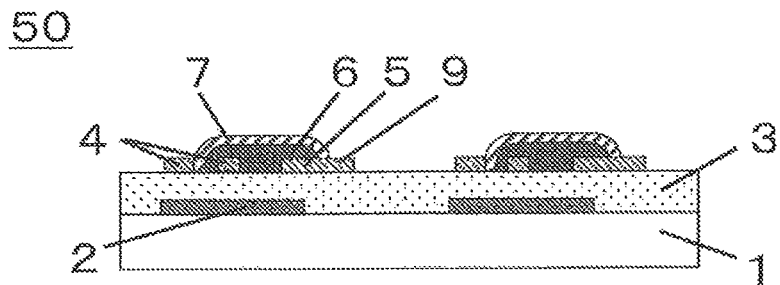

With reference to FIGS. 2A-2C, the second embodiment of the present invention will be described.

FIGS. 2A and 2B are plan views schematically showing an example of a thin film transistor array formed substrate 50 of the present invention, in which FIG. 2C is a cross-sectional view sectioned across the line C-C' of FIG. 2B.

As shown in FIG. 2A, when viewing a layout as a planar arrangement, the gate wiring 2' also serves as the gate electrode 2, and the source wiring 4 also serves as the source electrode having notch portions which are formed periodically, the source wiring 4 intersects the gate wiring 2', and the notch portions of the source wiring 4 are formed at portions overlapping the gate electrode 2. The source wiring 4 is composed of a source wiring 41 which is formed of the notch portions, having a small width, and a source wiring 42 having a large width and no notch portions. According to the present embodiment, the source wiring 4 has an opening 4a in the source wiring 42 having a large width and no notch portions, and has an opening 4b in the source wiring 41 having a small width and the notch portions. Also, the drain electrode 5 is formed in the notch portion of the source wiring 4, which faces the source wiring 4. Moreover, the pixel electrode 9 is connected to the drain electrode 5.

As shown in FIG. 2B, the semiconductor layer 6 is formed in a stripe shape having the longitudinal side extending in a direction where the source wiring 4 extends, and formed across the source wiring 4 and the drain electrode 5. The semiconductor layer 6 covers neither ends of the opening 4a in the width direction. Note that the width direction refers to a line width in a direction perpendicular to a direction where the source wiring 4 extends. Accordingly, a state where the both ends in the width direction are not covered refers to a state where the width of the semiconductor layer 6 shows narrow than that of the opening 4a. Therefore, a portion is formed between the semiconductor layer 6 and the source wiring 4 which also serves as a source electrode, where the gate insulation layer 3, as an under layer, is exposed. On the other hand, the protection layer 7 covers all of the semiconductor layer 6, the opening 4a and the opening 4b, and the protection layer 7 is not formed on the both ends of the opening 4a in the width direction and on a portion of the source wiring 4 located at a side of the opening 4b opposite to the drain electrode 5.

A cross-sectional view sectioned across the line C-C' of FIG. 2B is shown in FIG. 2C. As shown in FIG. 2C, the gate wiring 2 is formed on the substrate 1, which is covered by the gate insulation layer 3. Further, the source wiring 4 having openings at a part thereof and the drain electrode 5 are formed on the gate insulation layer 3. The semiconductor layer 6 is formed at a channel portion between the source wiring 4 and the drain electrode 5. The protection layer 7 is formed so as to cover the source wiring 4 in the drain electrode 5 side than to the opening, a part of the drain electrode 5 and the semiconductor layer 6.

In FIG. 2A, the surface of the gate insulation layer 3 has ink affinity properties, and the surfaces of the source wiring 4, the drain electrode 5 and the pixel electrode 9 have ink repellent properties.

Since the ink used for printing the semiconductor layer 6 is liquid, but has properties being unlikely to be influenced by the coating properties on the surface to be printed, the semiconductor layer 6 can be printed in a stripe shape. In this case, preferably, the both ends of the opening 4a and one side of the opening 4b located opposite to the drain electrode 5 are not covered by the semiconductor.

The ink used for printing the protection layer 7 is liquid, and the ink affinity portion of the surface to be printed is likely to be wet. Hence, even the ink repellent portion is unlikely to be wet, because of the openings 4a and 4b included in the source wiring 4, the ink of the protection layer 7 tends to remain in the source wiring 4, thereby preventing the ink from leaking onto the gate insulation layer 3.

The used material and the method are the same as that of the first embodiment.

Third Embodiment

Figure 3A:
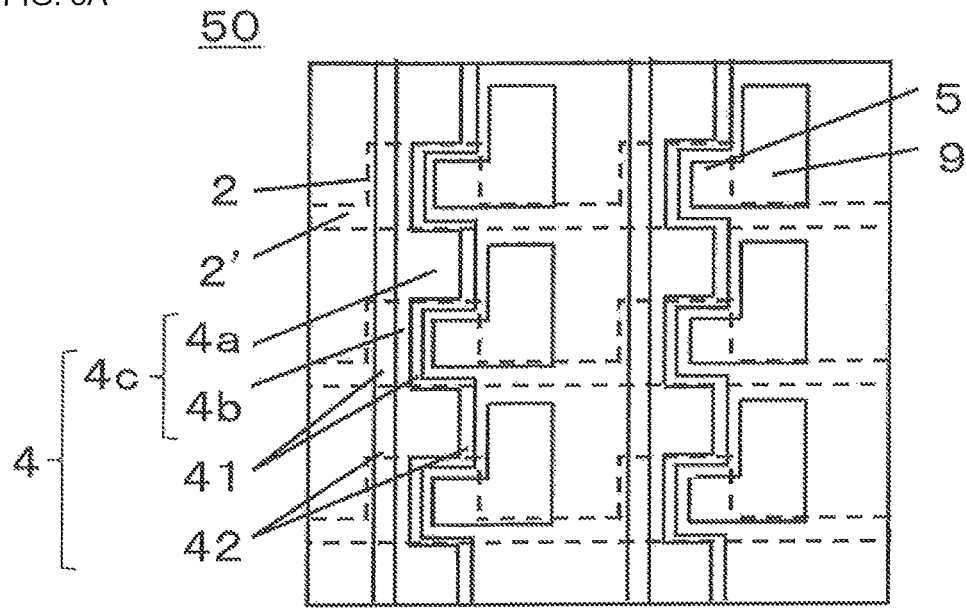
Figure 3B:
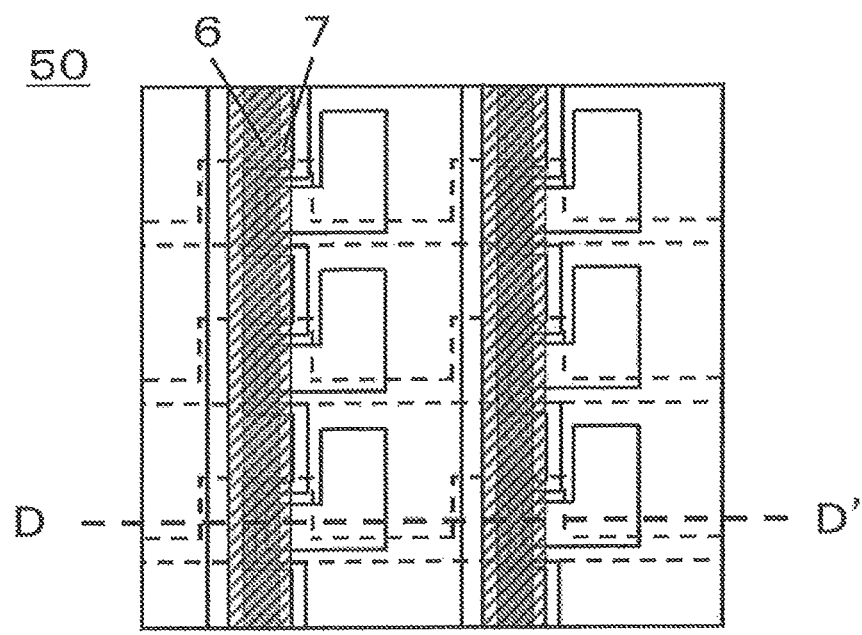
Figure 3C:
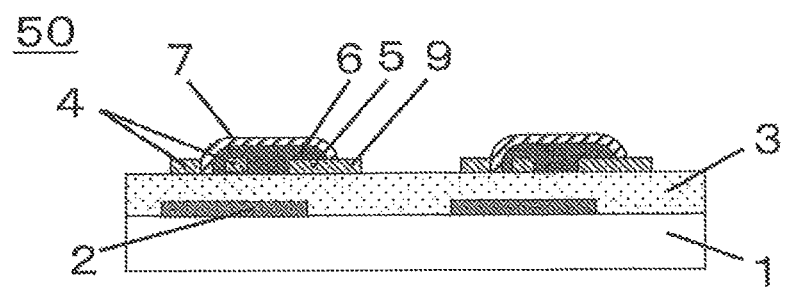

With reference to FIGS. 3A-3C, the third embodiment of the present invention will be described.

FIGS. 3A and 3B are plan views schematically showing an example of a thin film transistor array formed substrate 50 of the present invention, in which FIG. 3C is a cross-sectional view sectioned across the line D-D' of FIG. 3B. As shown in FIG. 3A, when viewing a layout as a planar arrangement, the gate electrode 2 is connected to the gate wiring 2', and the source wiring 4 also serves as the source electrode 4 having notch portions, the source wiring 4 intersects the gate wiring 2', and the notch portions of the source wiring 4 are formed on the gate electrode 2. The source wiring 4 is formed of a small width portion formed of the notch portions, and a large width portion where no notch portion is formed. According to the present embodiment, the opening 4a formed in the source wiring 42 having a large width shown in FIG. 3A, and an opening 4b formed in the source wiring 41 are connected to form an opening 4c communicated therebetween. As a result, the source wiring 4 shows a wiring constituted of a linear part and a rectangular-wave like part. Note that both parts are electrically connected.

Moreover, similar to the first and second embodiments, the drain electrode 5 is formed in the notch portion of the source wiring 4, facing the source wiring 4. The pixel electrode 9 is connected to the drain electrode 5. As shown in FIG. 3B, the semiconductor layer 6 is formed in a direction where the source wiring 4 extends, and formed across the source wiring 4 and the drain electrode 5. The semiconductor layer 6 is formed in a stripe shape extending in parallel to the source wiring 4, excluding a source wiring at the both ends in a width direction (perpendicular to a direction where the source wiring extends) of the opening 4c.

The protection layer 7 covers all of the semiconductor layer 6 and the opening 4c through which the source wiring 41 having small width and the source wiring 42 having large width are communicated. The protection layer 7 is not formed on the source wiring 4 at both ends side of the opening 4c in the width direction.

A cross-sectional view sectioned across the line D-D' of FIG. 3B is shown in FIG. 3C. As shown in FIG. 3C, the gate electrode 2, the gate wiring 2' are formed on the substrate 1, which is covered by the gate insulation layer 3. Further, the source wiring 4 having openings at a part thereof and the drain electrode 5 are formed on the gate insulation layer 3. The semiconductor layer 6 is formed at a channel portion between the source wiring 4 and the drain electrode 5. The protection layer 7 is formed so as to cover the source wiring 4 on the drain electrode 5 side than to the opening, a part of the drain electrode 5 and the semiconductor layer 6.

In FIG. 3A, the surface of the gate insulation layer 3 shows ink affinity properties, and the surfaces of the source wiring 4, the drain electrode 5 and the pixel electrode 9 show ink repellent properties.

Since the ink used for printing the semiconductor layer 6 is liquid, but has properties being unlikely to be influenced by the coating properties on the surface to be printed, the semiconductor layer 6 can be printed in a long stripe shape as expected. In this case, preferably, the semiconductor layer 6 does not cover a part of the source wiring having a large width, located at both ends of the opening 4a in the opening 4c, and a part of the source wiring having a small width, located at opposite side to the drain electrode with respect to the opening 4b. The ink used for printing the protection layer 7 is liquid, and the ink affinity portion of the surface to be printed is likely to be wet. Hence, even though the ink repellent portion is unlikely to be wet, because of the opening 4c included in the source wiring 4, the ink of the protection layer 7 tends to remain in the opening 4c in the source wiring 4, thereby preventing the ink from leaking onto the gate insulation layer 3.

The used material and the method are the same as that of the first embodiment.

Fourth Embodiment

Figure 4A:
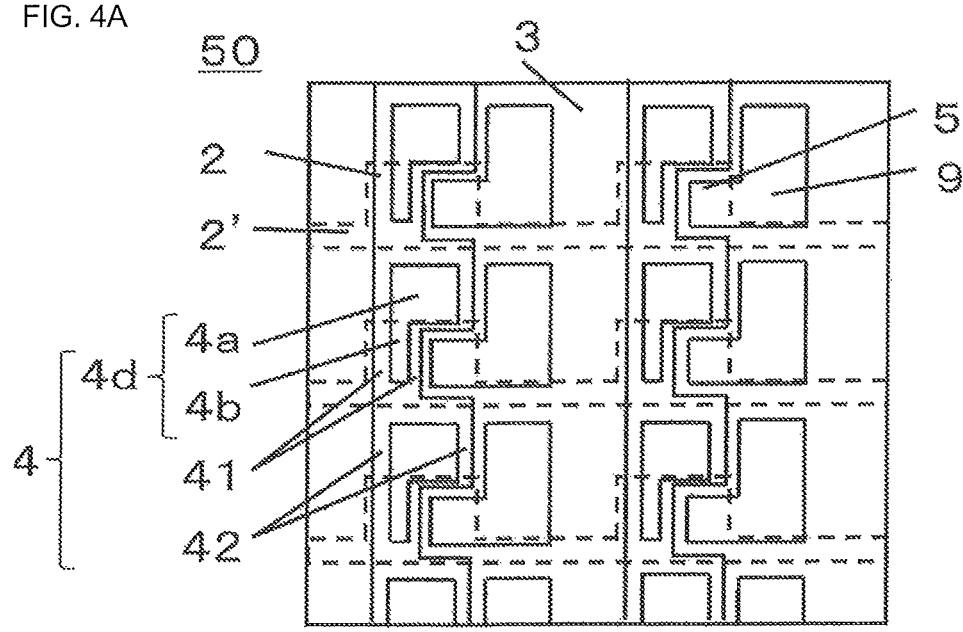
Figure 4B:
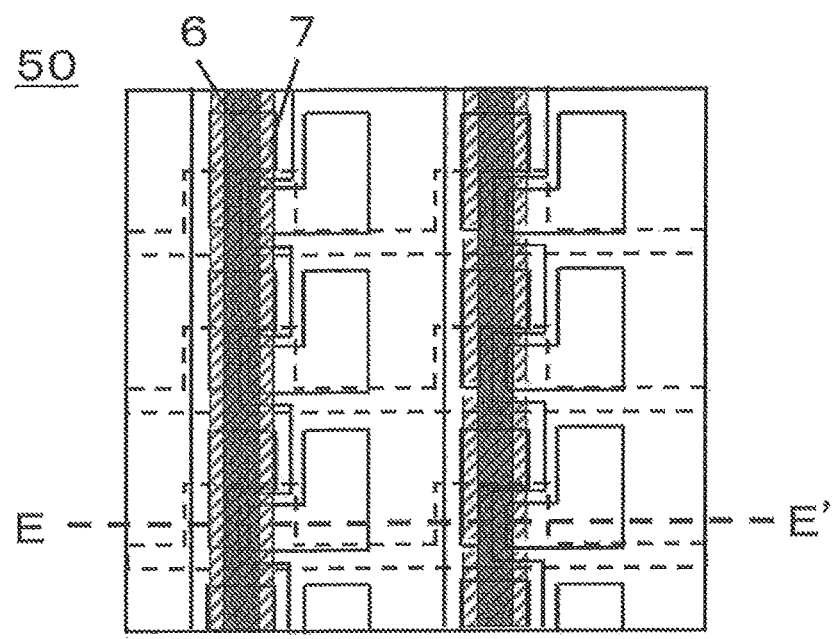
Figure 4C:
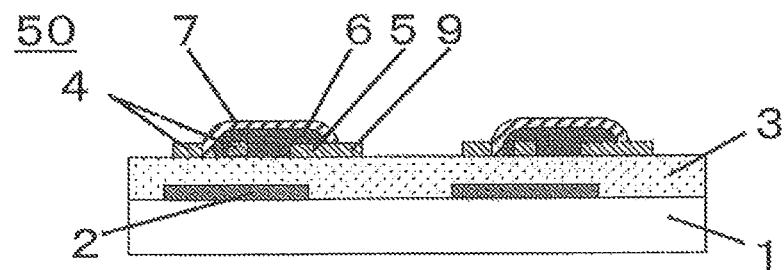

With reference to FIGS. 4A-4C, the fourth embodiment of the present invention will be described.

FIGS. 4A and 4B are plan views schematically showing an example of a thin film transistor array formed substrate 50 of the present invention, in which FIG. 4C is a cross-sectional view sectioned across the line E-E' of FIG. 4B. As shown in FIG. 4A, when viewing a layout as a planar arrangement, the gate electrode 2 is connected to the gate wiring 2', and the source wiring 4 also serves as the source electrode 4 having notch portions, the source wiring 4 intersects the gate wiring 2', and the notch portions of the source wiring 4 are formed on the gate electrode 2. The source wiring 4 is formed of a small width portion formed of the notch portions, and a large width portion where no notch portion is formed. According to the present embodiment, the opening 4a formed in the source wiring 42 having a large width, and an opening 4b formed in the source wiring 41 shown in FIG. 4A are partly connected to form an opening 4d communicated therebetween. As a result, the source wiring 4 has a wiring constituted of a linear part and a rectangular-wave like part. Note that both parts are electrically connected.

The opening 4d communicated therebetween may be partly connected between a plurality of openings 4a and 4b.

Moreover, similar to the first, second and third embodiments, the drain electrode 5 is formed in the notch portion of the source wiring 4, facing the source wiring 4. The pixel electrode 9 is connected to the drain electrode 5. As shown in FIG. 4B, the semiconductor layer 6 is formed in a direction where the source wiring 4 extends, and formed across the source wiring 4 and the drain electrode 5. The semiconductor layer 6 is formed in a stripe shape extending parallel to the source wiring 4, excluding a source wiring at the both ends in a width direction (perpendicular to a direction where the source wiring extends) of the opening 4d.

The protection layer 7 covers all of the semiconductor layer 6 and the openings 4d through which the source wiring 42 having large width and the source wiring 41 having small width are partly communicated. The protection layer 7 is not formed on the source wiring 4 at both ends side of the opening 4d in the width direction.

A cross-sectional view sectioned across the line E-E' of FIG. 4B is shown in FIG. 4C. As shown in FIG. 4C, the gate electrode 2, the gate wiring 2' is formed on the substrate 1, which is covered by the gate insulation layer 3. Further, the source wiring 4 having openings at a part thereof and the drain electrode 5 are formed on the gate insulation layer 3. The semiconductor layer 6 is formed at a channel portion between the source wiring 4 and the drain electrode 5. The protection layer 7 is formed so as to cover the source wiring 4 in the drain electrode 5 side than to the opening, a part of the drain electrode 5 and the semiconductor layer 6.

In FIG. 4A, the surface of the gate insulation layer 3 has ink affinity properties, and the surfaces of the source wiring 4, the drain electrode 5 and the pixel electrode 9 have ink repellent properties.

Since the ink used for printing the semiconductor layer 6 is liquid, but has properties being unlikely to be influenced by the coating properties on the surface to be printed, the semiconductor layer 6 can be printed in a long stripe shape as expected. In this case, preferably, the semiconductor layer 6 does not cover a part of the source wiring having a large width, located at the both ends of the opening 4a in the opening 4d, and a part of the source wiring 4 having a small width, located at opposite side to the drain electrode 5 with respect to the opening 4b. The ink used for printing the protection layer 7 is liquid, and the ink affinity portion of the surface to be printed is likely to be wet. Hence, even the ink repellent portion is unlikely to be wet, because of the opening 4d included in the source wiring 4, the ink of the protection layer 7 tends to remain in the opening 4d in the source wiring 4, thereby preventing the ink from leaking onto the gate insulation layer 3.

The material and the method are the same as that of the first embodiment.

In the embodiments 1 to 4, a capacitor electrode and a capacitor wiring which are not shown may be arranged in the same layer as the gate electrode 2 and the gate wiring 2'. The capacitor electrode becomes a storage capacitor when overlapped with the pixel electrode 9 via the gate insulation layer 3. The storage capacitor maintains the voltage of the pixel electrode.

Fifth Embodiment

Figure 5A:
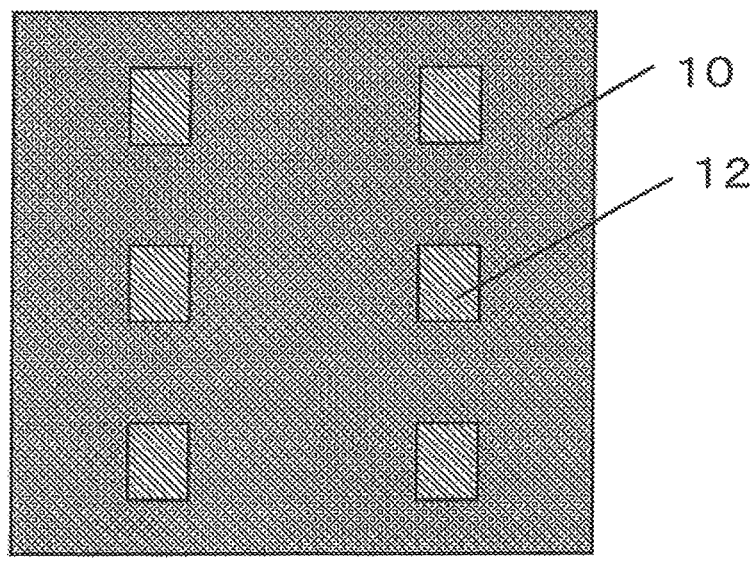
Figure 5B:
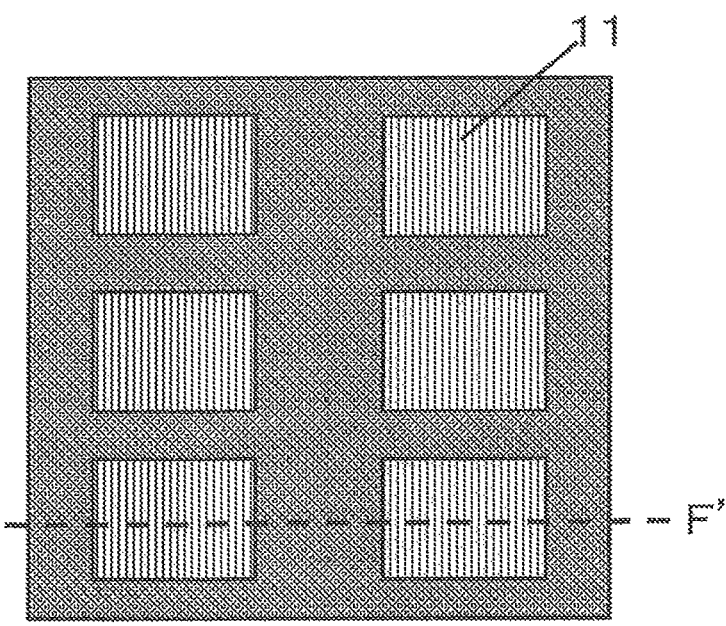
Figure 5C:
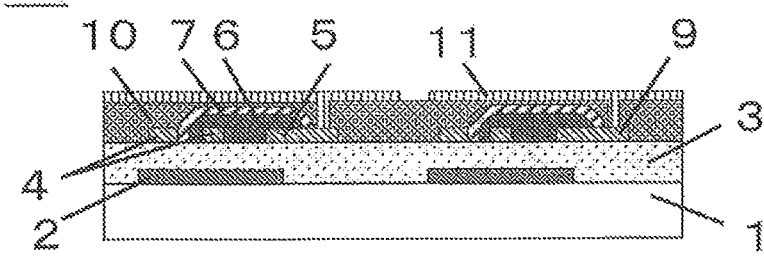

With reference to FIGS. 5A-5C, the fifth embodiment of the present invention will be described.

The fifth embodiment of the present invention is an image display device substrate 60 provided with a thin film transistor array formed substrate 50.

The image display device substrate 60 as the fifth embodiment of the present invention is provided with, as shown in FIG. 5C, an interlayer insulation layer 10 formed on the thin film transistor array formed substrate 50 according to any one of the first to fourth embodiments of the present invention. Further, the image display device substrate 60 includes an opening 12 in the interlayer insulation layer 10 formed on the pixel electrode 9. In this case, the opening 12 of the interlayer insulation layer 10 serves as an effective pixel region. Alternatively, an upper pixel electrode 11 is further formed on the interlayer insulation layer 10 and the upper electrode 11 is connected to the pixel electrode 9, whereby the upper pixel electrode 11 serves as an effective pixel region.

FIG. 5A is an overall plan view showing an example of a state where the interlayer insulation layer 10 is formed on the thin film transistor array formed substrate 50 of the present invention, including openings at required portions. FIG. 5B is an example of a brief plan view showing an example of a state where the upper pixel electrode 11 is formed on the configuration shown in FIG. 5A. FIG. 5C illustrates a state where the upper pixel electrode 11 is connected to the pixel electrode 9 via the opening 12 of the interlayer insulation layer 10.

As a material of the interlayer insulation layer 10, polyvinyl phenol, acryl, epoxy, polyimide or the like can be used. As a method for forming the interlayer insulation layer 10, screen printing is preferably used. However, a photosensitive interlayer insulation layer may be formed, and then exposed/developed, thereby forming the interlayer insulation layer 10.

As a material for forming the upper pixel electrode 11, metal such as Al, Cr, Au, Ag, Ni and Cu, or a transparent conductive layer such as ITO can be used. As a method for forming the upper pixel electrode 11, it is possible to apply photolithography or etching after performing a film-formation using deposition or sputtering. However, screen printing is preferably applied using Ag ink, Ni ink, Cu ink or the like.

EXAMPLES

Hereinafter, examples of the present invention will be described in detail. However, the present invention is not limited to these examples.

Example 1

The inventors prepared a substrate 1 on which the gate wiring 2' and the gate insulation layer 3 are formed shown in FIGS. 1A-1C, and formed the source wiring 4 and the drain electrode 5 by using a printing method. The semiconductor layer 6 was formed over a plurality of transistors, by using a coating method, in a region of the source wiring 4 including notch portions such that the semiconductor layer 6 was formed in a long stripe shape not to coat the entire opening 4a of the source wiring having a large width, but to expose a part of the opening 4a. Next, the protection layer 7 was formed over the plurality of transistors in a long stripe shape, by using a coating method, to cover the entire semiconductor layer 6 and the openings 4a of the source wiring having a large width and the source wiring 4 in a side opposite to the drain electrode 5.

A manufacturing method of forming a bottom gate/bottom contact type thin film transistor is described. As a material of the substrate 1, polyethylene naphthalate (PEN) having a thickness of 125 μm was used.

Next, as the gate wiring 2', nanosilver ink is used in which the weight ratio between nanosilver and polyethylene glycol #200 is 8:1. The nanosilver ink is printed on a PEN substrate 1 by transfer printing, followed by a baking at 180° C. for one hour to form the gate wiring 2'.

Next, as a material of the gate insulation layer 3, a solution was used in which polyvinyl phenol was dissolved into cyclohexanone at 10 weight %. A solution of the gate insulation layer 3 is coated by a die coater method, followed by a drying at 180° C. at one hour. The contact angle of the water of the gate insulation layer 3 was 75° or less.

Next, as the material of the source wiring 4 and the drain electrode 5, nanosilver ink is used in which the weight ratio between nanosilver and polyethylene glycol #200 is 8:1. The nanosilver ink is printed by transfer printing, followed by drying at 180° C. for one hour to form the source wiring 4 and the drain electrode 5. The contact angle of the water of the source wiring 4 and the drain electrode was 80° or more.

Next, as the semiconductor layer 6, a solution was used in which fluorene-bithiophene copolymer (F8T2) was dissolved into tetralin at 1.0 weight %. The semiconductor layer 6 was formed over the plurality of transistors using a coating method such that the semiconductor layer 6 was coated on the region of the source wiring 4 having notch portions, followed by the drying at 100° C. for one hour.

Next, as a material of the protection layer 7, an ink was used in which polyvinyl alcohol was dissolved into the pure water at 5 weight % to form the protection layer 7 right above the semiconductor layer 6.

Example 2

The inventors prepared a substrate shown in FIGS. 2A-2C on which the gate wiring and the gate insulation layer were formed, and formed the source wiring and the drain electrode by using a printing method. An etching was performed to form the opening 4a in the source wiring having a large width and the opening 4b in the source wiring having a small width. The semiconductor layer 6 was formed over the plurality of transistors, by using a coating method, in a long stripe shape not to coat the entire opening of the source wiring having a large width, but to allow a part of the opening 4a to remain exposed. Next, the protection layer 7 was formed over the plurality of transistors in a long stripe shape, by using a coating method, to cover the entire semiconductor layer and the openings 4a of the source wiring having a large width and the source wiring 4 in a side opposite to the drain electrode 5.

The method for forming the source wiring 4 and the drain electrode 5 except pattern of the printing plate and the material thereof are the same as that of the example 1.

After forming the source wiring 4, by using etchant, the openings were formed in the source wiring having a large width.

The forming processes after forming the semiconductor layer and the material thereof were the same as that of the example 1.

The above two types of protection layer patterns were considered.

The openings are provided in a source wiring having concave-convex portion, that is a source wiring part having a large width and a source wiring part having a small width, whereby a desired pattern of the protection layer was able to be formed regardless of a wettability of the surface to be printed.

Comparative Example 1

Figure 6A:
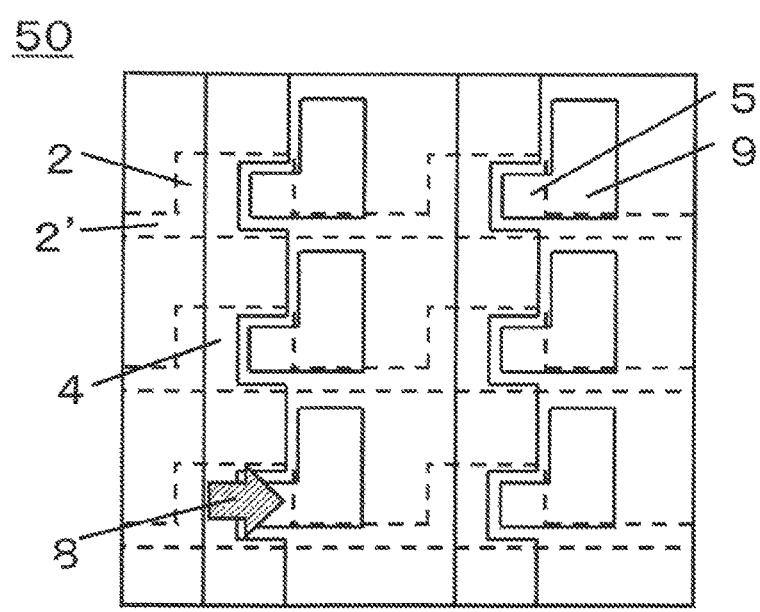
Figure 6B:
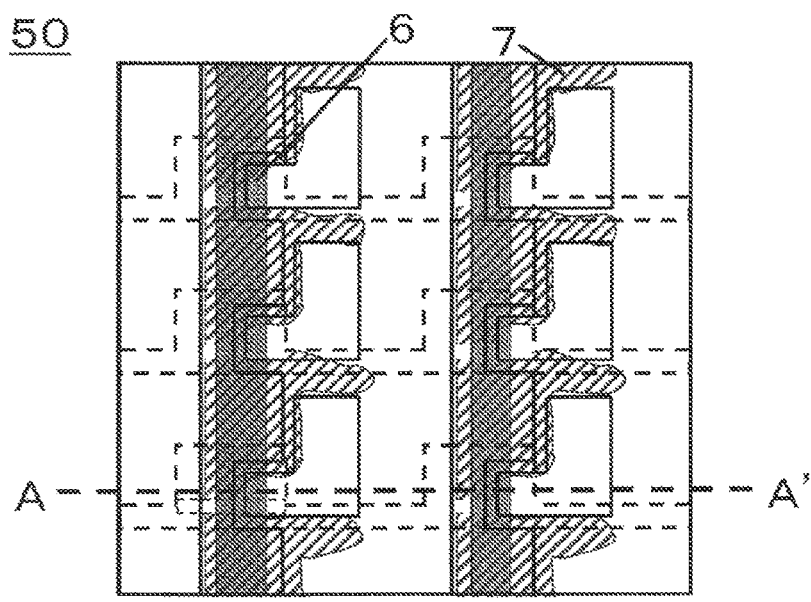
Figure 6C:
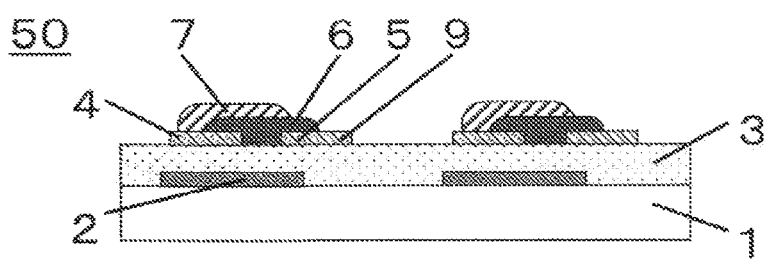

As shown in FIGS. 6A-6C, with a printing method, the source wiring 4 and the drain electrode 5 are formed on the substrate 1 on which the gate wiring 2' and the gate insulation layer 3 are formed. With a coating method, the semiconductor layer 6 is formed in a long stripe shape over the plurality of transistors. Next, with a coating method, the protection layer 7 was formed so as to coat the entire semiconductor 6 over the plurality of transistors.

The pattern of the protection layer was influenced by the wettability of the surface to be printed so that a desired long stripe pattern could not be formed. Hence, the entire semiconductor layer was not be able to be coated.

As described, according to embodiments of the present invention, without increasing the number of manufacturing processes, the source wiring has periodic notch patterns in the width direction, and the openings are formed in the source wiring, whereby leakage is avoided when the protection layer is formed and desired protection layer pattern can be formed.

When pattering a protection layer, generally, a photolithography process may be used for the pattering. However, photolithography process requires a large number of manufacturing processes, and has disadvantages that high cost is required for equipment and materials for the patterning.

In contrast, according to a printing method, by using a printing plate, it is possible to form the protection layer pattern without increasing the number of manufacturing processes. However, when the surface to be printed is composed of a plurality of materials, there is a concern that the printed pattern may be different from the designed pattern. For example, when the printed semiconductor layer connects between the source and the drain on a portion where the gate electrode is not formed, off current increases. Also, when the protection layer is not able to cover the semiconductor layer completely, the semiconductor cannot be prevented from being degraded.

The present invention has an aspect to provide a substrate for forming a thin film transistor array capable of performing patterning favorable for the semiconductor layer and the protection layer, a manufacturing method thereof, and an image display device substrate using the substrate for forming the thin film transistor array.

A first aspect of the present invention is a thin film transistor array substrate prepared including a gate electrode; a gate insulation layer; a source electrode; a drain electrode; a pixel electrode connected to the drain electrode; a semiconductor layer; and a protection layer, which are laminated in this order. A source wiring serving as both the source wiring and the source electrode has notch portions periodically formed in a direction where the source wiring extends; the notch portions of the source wiring are formed at portions overlapping the gate electrode; portions where the notch portions exist correspond to a source wiring having a small width, and portions where no notch portions exist correspond to a source wiring having a large width which is wider than the source wiring having the small width; the source wiring having the large width at least includes an opening; the semiconductor layer is formed in a stripe shape having a longitudinal side extending in a direction where the source wiring extends, and forming across the source electrode and the drain electrode; and the protection layer is formed to cover an entire portion of the semiconductor layer.

The source wiring having a small width may include another opening.

The opening of the source wiring having the small width and the opening of the source wiring having the large width may be communicated in a direction where the source wiring extends.

The opening of the source wiring having the small width and the opening of the source wiring having the large width may form an opening in a direction where the source wiring extends, the opening partly communicating therethrough.

Other aspect of the present invention is an image display device substrate provided with an interlayer insulation layer on the above-described thin film transistor array formed substrate, having an opening in the interlayer insulation layer at a portion corresponding to the pixel electrode in the interlayer insulation layer.

An upper pixel electrode may be further provided on the interlayer insulation film, and the upper pixel electrode may be connected to the pixel electrode of the thin film transistor array formed substrate via the opening of the interlayer insulation layer.

Other aspect of the present invention is a manufacturing method of forming the above-described thin film transistor array substrate including processes performed in the order of: a process of forming a gate electrode on a substrate; a process of forming a gate insulation layer on the substrate including the gate electrode; a process of simultaneously forming a source wiring serving as both the source wiring and a source electrode, a drain electrode and a pixel electrode; a process of forming a semiconductor layer by a printing method using liquid state ink; and a process of forming a protection layer by a printing method using the liquid state ink.

Offset printing may be used for forming the source wiring serving as both the source wiring and the source electrode, the drain electrode and the pixel electrode, in the process of simultaneously forming a source wiring serving as both the source wiring and a source electrode, a drain electrode and a pixel electrode.

The semiconductor layer may be formed to cover neither both ends in a width direction of the opening of the source wiring, in the process of forming the semiconductor layer.

The protection layer may be formed to cover all of the semiconductor layer and the opening of the source wiring, in the process of forming the protection layer.

According to embodiments of the present invention, without increasing the number of manufacturing processes, a substrate for forming a thin film transistor array capable of performing favorable patterning of a semiconductor layer and a protection layer, a manufacturing method thereof, and an image display device substrate using the substrate for the thin film transistor array can be provided.

Obviously, numerous modifications and variations of the present invention are possible in light of the above teachings. It is therefore to be understood that within the scope of the appended claims, the invention may be practiced otherwise than as specifically described herein.

What is claimed is:

1. A thin film transistor array formed substrate, comprising:
   a gate electrode formed on a substrate;
   a gate insulation layer formed on the gate electrode;
   a source wiring structure including a source wiring and a source electrode formed on the gate insulation layer;
   a drain electrode formed on the gate insulation layer;
   a pixel electrode connected to the drain electrode;
   a semiconductor layer formed on a top surface of the source electrode and the drain electrode such that the source electrode and the drain electrode are between the gate insulation layer and at least portion of the semiconductor layer, in a stripe shape having a longitudinal side extending in a direction that the source wiring extends; and
   a protection layer formed on the semiconductor layer such that the protection layer covers an entire portion of the semiconductor layer,
   wherein the source wiring structure has a plurality of notch portions positioned in the direction that the source wiring extends such that the notch portions overlap with the gate electrode, the source wiring has a first portion having a first width where the notch portions are formed and a second portion having a second width larger than the first width where no notch portions are formed, and the source wiring has an opening in the second portion.

2. The thin film transistor array formed substrate of claim 1, wherein the semiconductor layer does not cover a drain side portion of the opening.

3. The thin film transistor formed substrate of claim 2, wherein the source wiring has the opening in the first portion and the opening in the second portion which are communicated in the direction in which the source wiring extends.

4. The thin film transistor array formed substrate of claim 3, wherein the semiconductor layer does not cover a portion of the source wiring, located at each end of the opening in the second portion, and another portion of the source wiring, located at an opposite side of the drain electrode with respect to the opening in the first portion.

5. The thin film transistor array formed substrate of claim 2, wherein the source wiring has the opening in the first portion and the opening in the second portion which are partially communicated in the direction in which the source wiring extends.

6. The thin film transistor array formed substrate of claim 5, wherein the semiconductor layer does not cover a portion of the source wiring, located at each end of the opening in the second portion, and another portion of the source wiring, located at an opposite side of the drain electrode with respect to the opening in the first portion.

7. An image display device substrate, comprising:
   the thin film transistor array formed substrate of claim 2; and
   an interlayer insulation layer formed on the thin film transistor array formed substrate,
   wherein the interlayer insulation layer has an opening in a portion corresponding to the pixel electrode.

8. The image display device substrate of claim 7, further comprising:
   an upper pixel electrode formed on the interlayer insulation layer and connected to the pixel electrode via the opening of the interlayer insulation layer.

9. The thin film transistor array formed substrate of claim 1, wherein the source wiring has an opening in the first portion.

10. The thin film transistor array formed substrate of claim 9, wherein the semiconductor layer does not cover either end of the opening in the second portion and one side of the opening in the first portion, located at an opposite side of the drain electrode.

11. An image display device substrate; comprising:
    the thin film transistor array formed substrate of claim 1; and
    an interlayer insulation layer formed on the thin film transistor array formed substrate,
    wherein the interlayer insulation layer has an opening in a portion corresponding to the pixel electrode.

12. The image display device substrate of claim 11, further comprising:
    an upper pixel electrode formed on the interlayer insulation layer and connected to the pixel electrode via the opening of the interlayer insulation layer.

13. The thin film transistor array formed substrate of claim 1, wherein a portion of the semiconductor layer does not contact the gate insulation layer, and another portion of the semiconductor layer contacts the gate insulation layer.

14. The thin film transistor array formed substrate of claim 1, wherein a first portion of the semiconductor layer covers the source electrode, a second portion of the semiconductor layer covers the drain electrode, and a third portion of the semiconductor layer is between the source electrode and the drain electrode and covers the gate insulation layer.

* * * * *